United States Patent [19]
Dauwen et al.

[11] Patent Number: 5,229,773
[45] Date of Patent: Jul. 20, 1993

[54] CHIRAL ABSORBING STRUCTURE

[75] Inventors: Jan M. A. Dauwen, Bekkevoort; August T. Timmerman, Westerlo; Michel A. C. Van Craenendonck, Mol; Hugo F. Pues, Keerbergen, all of Belgium

[73] Assignee: Grace N.V., Westerlo, Belgium

[21] Appl. No.: 866,593

[22] Filed: Apr. 10, 1992

[30] Foreign Application Priority Data

Jun. 28, 1991 [GB] United Kingdom .............. 9114060.8

[51] Int. Cl.$^5$ ............................................ H01Q 17/00
[52] U.S. Cl. ............................................ 342/1; 342/4
[58] Field of Search ................... 342/1, 2, 3, 4

[56] References Cited

U.S. PATENT DOCUMENTS

| | | |
|---|---|---|
| 2,841,736 | 7/1958 | Dicke . |
| 4,948,922 | 8/1990 | Varadan et al. ............. 174/35 |
| 5,063,391 | 11/1991 | Jaggard et al. ............. 343/703 |
| 5,099,242 | 3/1992 | Jaggard et al. ............. 342/1 |

FOREIGN PATENT DOCUMENTS 9004210 4/1990 PCT Int'l Appl. .

OTHER PUBLICATIONS

"Chiro Shield: A Salisbury/Pallenbach Shield Alternative," *Electronics Letter*, 16th Aug. 1990, vol. 26, No. 17, pp. 1332-1333.
Varadan et al, "On the Possibility of Designing Antireflection Coatings Using Chiral Composites", Jor. of Wave Material Interaction, vol. 2, No. 1 (Jan. 1987).
D. L. Jaggard et al, Applied Physics, 18, 211, 1979.
Tinoco et al., "The Optical Activity of Oriented Helices," J. Phys. Chem., 61, 1196 (1957).
A. Lakhtakia et al., "A Parametric Study of Micro Reflection Characteristics of a Planar Achiral-Chiral Interface," IEEE Transactions on Electromagnetic Compatability, vol. EMC-28, No. 2 (May, 1986).
S. Bassiri et al., J. Opt, Soc. Am. A5, 1450, 1988.
A. Lakhtakia et al., "Scattering and Absorption Characteristics of Lossy Dielectric, Chiral, Non-Spherical Objects," Applied Optics, vol. 24, No. 23 Dec. 1, 1985.
S. Bassiri et al., Alta Frequenza, 2, 83, 1986.
M. Ali Omar, Elementary Solid State Physics, pp. 163-166; 389-394 (1975).

*Primary Examiner*—T. H. Tubbesing
*Attorney, Agent, or Firm*—John Dana Hubbard; William L. Baker

[57] ABSTRACT

An absorbing assembly for absorbing electromagnetic radiation in the range 10 MHz to 100 GHz comprises a lossy dielectric material and chiral elements disposed outside the lossy dielectric. The chiral elements may be springs, Mobius bands, irregular tetrahedra, tapering helical springs or handed non-planar forks. The lossy dielectric material may be in the form of a shaped structure e.g. for use in an anechoic chamber.

18 Claims, 10 Drawing Sheets

CHIRAL ABSORBING STRUCTURE

FIELD OF THE INVENTION

This invention relates to a chiral absorbing structure, in particular for use in absorbing electromagnetic radiation in the frequency range of 10 megahertz to 100 gigahertz. These are of great importance in providing anti-reflection materials.

BACKGROUND OF THE INVENTION

Until the discovery of chiral activity, the development of electromagnetic radiation absorbing material was limited to design variations in $\epsilon$, the permittivity, and $\mu$, the magnetic permeability of the absorbing material. In order to match the impedance of the absorbing material to the free space impedance $\epsilon_r$ (relative permittivity) and $\mu_r$ (relative permeability) are ideally equal. Practical consideration, however, dictate that this is not possible, with the result that the development of absorbers had been confined to searching for compromise combinations of $\epsilon_r$ and $\mu_r$ for the absorbing material which produce the best results. There were therefore 2 degrees of freedom in choosing the properties of the absorber.

The introduction of chirality into an absorber produces an extra degree of freedom, expressed by the chirality parameter $\beta$, for the choice of properties of the absorbing material.

Chirality is the handedness of an object, that is, the property of an object which renders it non-congruent with its mirror image. Work carried out on chiral absorbing materials indicates that electromagnetic radiation incident on an absorbing material containing chiral inclusions is caused to decompose into left-and right-circulatory polarized forms and be scattered through the lossy dielectric material which is host to the chiral inclusions.

According to the present invention there is provided an electromagnetic radiation absorbing structure comprising a structure for absorbing radiation in the range 10 megahertz to 100 gigahertz comprising: (a) a geometrically shaped lossy dielectric medium; and, (b) chiral elements disposed outside the lossy dielectric medium.

The teaching of the prior art is that chirality is only effective when, in a lossy host. Tests conducted on chiral elements alone show no absorptive properties. With the structure of the present invention, it has been found that enhanced absorption can be achieved by the addition of chiral elements to the exterior surface of a lossy dielectric material, that is, the chiral elements do not have to be embedded within a lossy dielectric host, but rather may be adjacent it while still enhancing the absorption properties of the overall structure.

SUMMARY OF THE INVENTION

The present invention has a number of advantages. One of these is that the manufacture of the overall structure is particularly simple as compared with the absorbers of the "included" type. The control of the dispersion or distribution of chiral elements is particularly easy to achieve as compared with the prior art, in which the distribution of elements is subject to the vagaries of mixing. A second advantage is that where the lossiness of the lossy dielectric is adjusted, or produced by addition e.g. by the steeping of a foam in a suspension or solution of carbon black, the absence of the chiral elements during manufacture is especially advantageous. Generally, the absorption of the lossy dielectric is adjusted by squeezing the foam in order to limit the quantity of carbon black in the foam to the desired quantity before drying. Such a process would not be possible in the presence of chiral elements within the foam.

With the present invention, the chiral elements do not have to be in the lossy part of the absorbing structure, but rather in a non-lossy part, i.e. on the surface of the lossy material and in free space, or embedded in a non-lossy matrix which is adjacent the lossy material. The use of chiral elements in a non-lossy foam for example allows the modular construction of absorbing structures allowing different combinations of $\beta$, $\epsilon_r$ and $\mu_r$ to be produced without committing materials to a combination of all three in a single structure. For the purposes of the present invention, the terms "low loss" and "non-lossy" are intended to refer to a material which has a loss tangent $\tan \delta$ of less than 0.1. The term lossy, in the present context, is intended to refer to a material with a loss tangent $\tan \delta$ of greater than 0.1.

In the present content it is preferable, but not essential that the loss tangent and dielectric constant of the low loss host material are less than 0.01 and 1.25 respectively. In the case of the lossy materials, the loss tangent and dielectric constant are preferably greater than 0.85 and 2.6 respectively at 10 gigahertz. The dielectric constant of the low loss materials may approach such a high value as 1.5 in cases where the material considerations are not purely on the basis of electromagnetic radiation absorption, for example mechanical requirements may dictate that high density foams be used, rather than low density foams. Such high density foams naturally have somewhat higher dielectric constants, and therefore for the same loss tangent, a somewhat higher imaginary dielectric constant component and increased insertion loss. It is regarded that such a component is nevertheless so small as to be insignificant and its effect be unmeasurable.

The present invention is concerned with the production of absorbing structures in the range 10 MHz to 100 GHz; it should be borne in mind that the properties of materials such as lossy dielectrics, in particular the loss tangent and dielectric constant are frequency dependent to the extent that a material or structure whether according to the present invention or not, which exhibits high reflection attenuation at one frequency within the range, may in fact exhibit strong reflections at other frequencies, especially surface reflection due to the severity of the discontinuity of properties such as permittivity.

It should therefore not be expected that a particular absorbing structure according to the invention will work over the full range claimed, but rather that the present invention provides an instruction for the production of an improved absorber whose properties will be apparent only in parts of the range particular to that absorber. Absorption elsewhere in the range will be exhibited with different combinations of properties.

THE DRAWINGS

The invention will further be understood from the following description when taken together with the attached drawings which are given by way of example only and in which:

FIG. 1 shows a first embodiment of the invention;
FIG. 2 shows a second embodiment of the invention;
FIG. 3 shows a third embodiment of the invention;

Figure 10:
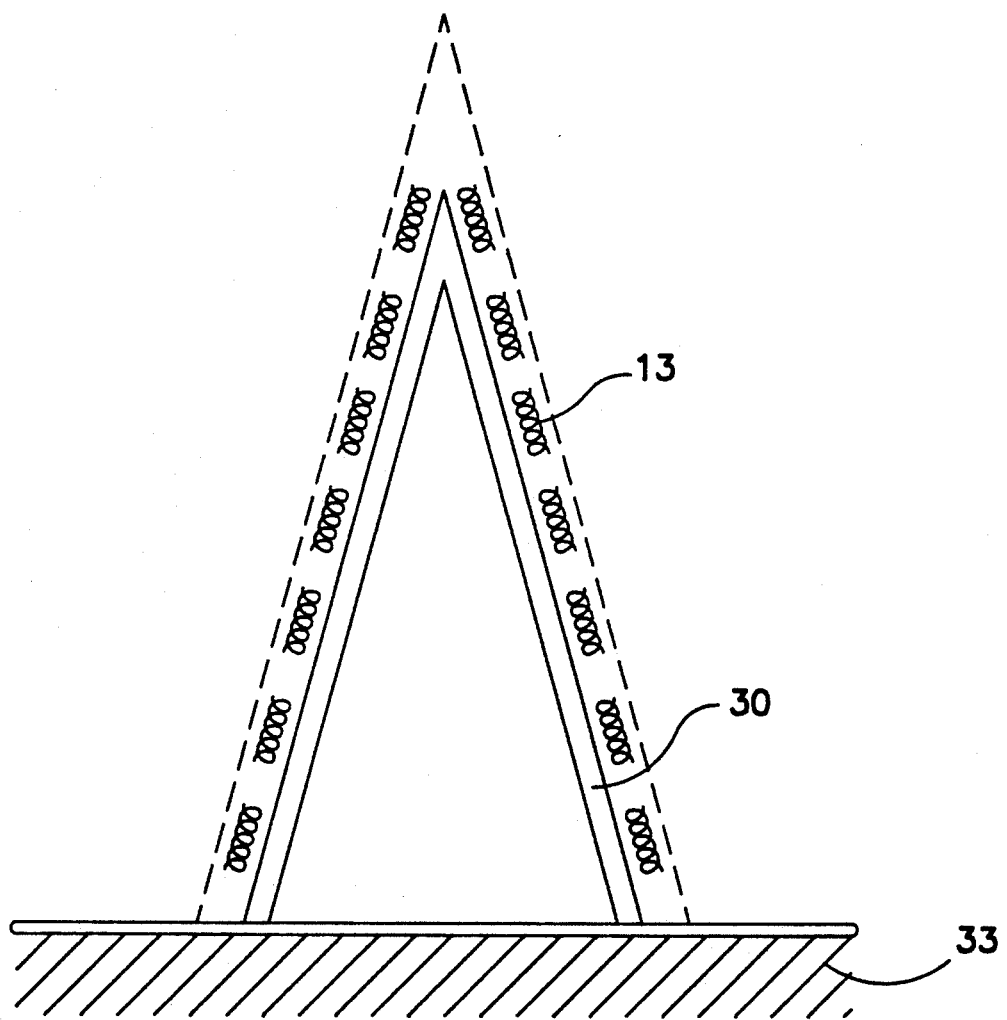
FIG. 10 shows a fourth embodiment of the invention.
Figure 11A:
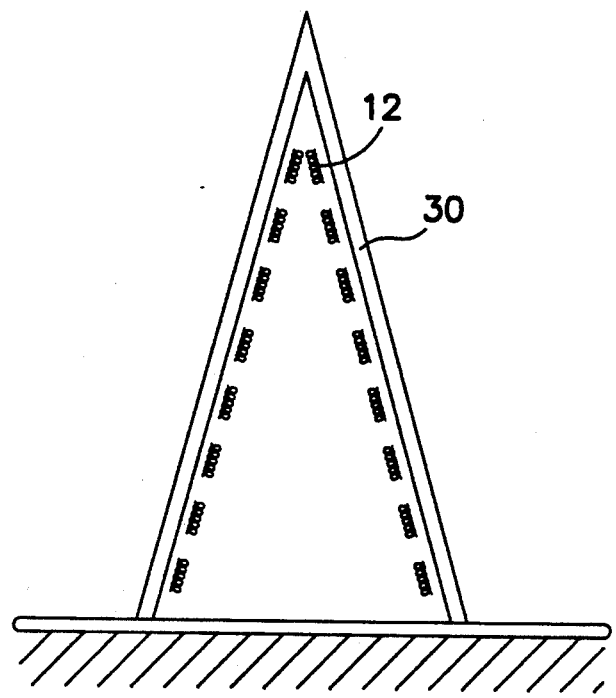

FIGS. 11a, b show alternative arrangements of the embodiment of FIG. 10.

DETAILED DESCRIPTION

Figure 1:
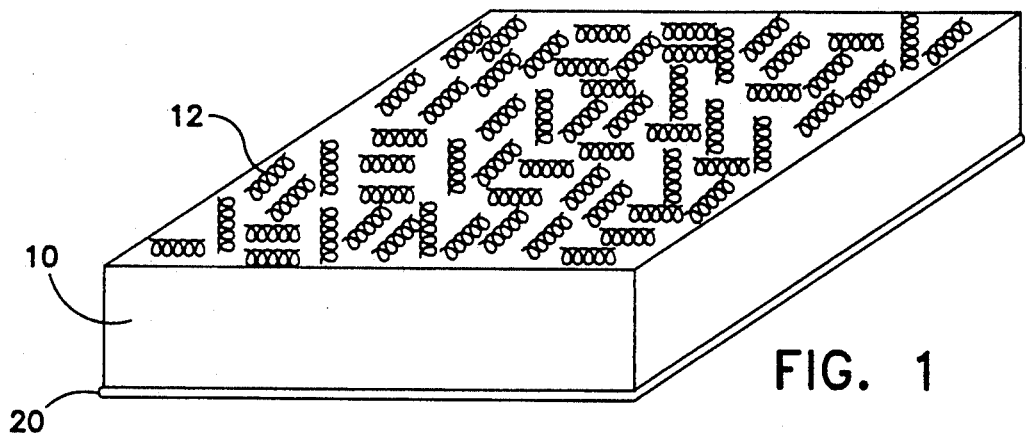

FIG. 1 shows an embodiment of the invention in which chiral elements 12, in this case, metallic helical springs are superposed on a lossy dielectric material 10. The structure is shown in position over a reflective surface 20, such as a metallic sheet.

Figure 2:
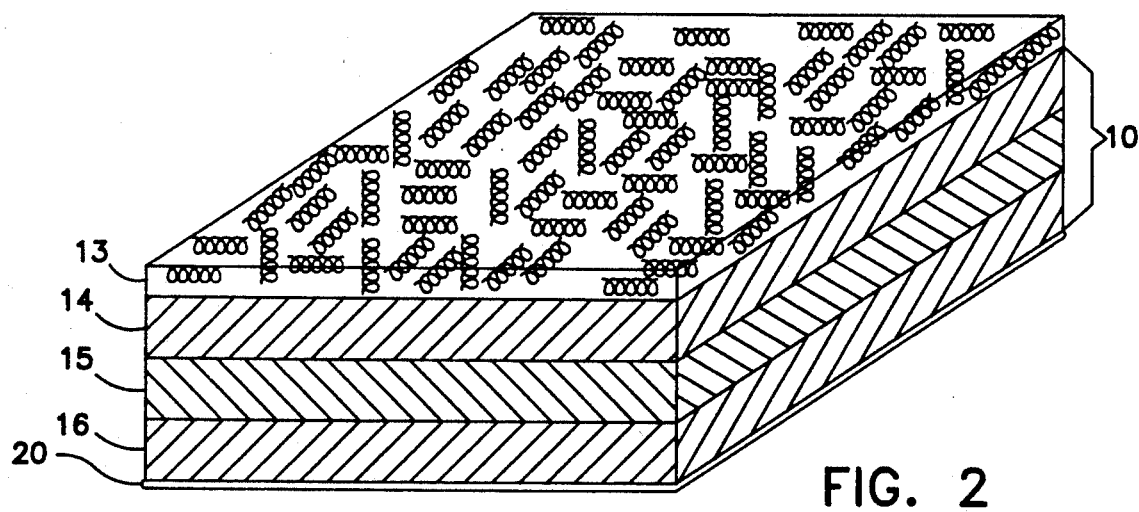

FIG. 2 shows an alternative embodiment of the invention in which the chiral elements are embedded in a non-lossy foam 13. This foam layer is then superposed on the lossy dielectric medium 10, which in this case comprises a dielectric of increasing permittivity through its depth. This is produced in this instance by the superposition of the layers 14, 15 and 16 of absorbing material of successively increased loss tangent and dielectric constant.

In the embodiments shown, the lossy dielectric medium may be, for instance, from the ECCOSORB LS (T.M.) series produced by Emerson & Cuming. An example of a multi-layer lossy foam is ECCOSORB AN (T.M.), with increased insertion loss through its depth. The chiral elements may be embedded in a non-lossy foam such as ECCOFOAM FPH (T.M.) which has a real permittivity of 1.1 and a loss tangent of the order of $10^{-4}$. The non-lossy foam is generally applicable to the embodiment of FIG. 1, as is the progressively lossy dielectric assembly shown in FIG. 2.

Helices which may be used as chiral elements in the absorber are given, by way of non-limitative example only, in the table below:

| HELIX | WIRE DIAMETER (mm) | COIL DIAMETER (mm) | PITCH | LENGTH (mm) |
|---|---|---|---|---|
| 1 | 0.2 | 1.0 | 0.32 | 2.0 |
| 2 | 0.25 | 1.2 | 0.36 | 2.4 |
| 3 | 0.32 | 1.6 | 0.51 | 6.3 |
| 4 | 0.32 | 2.0 | 0.63 | 5.3 |
| 5 | 0.32 | 2.5 | 0.78 | 4.7 |

Figure 3:
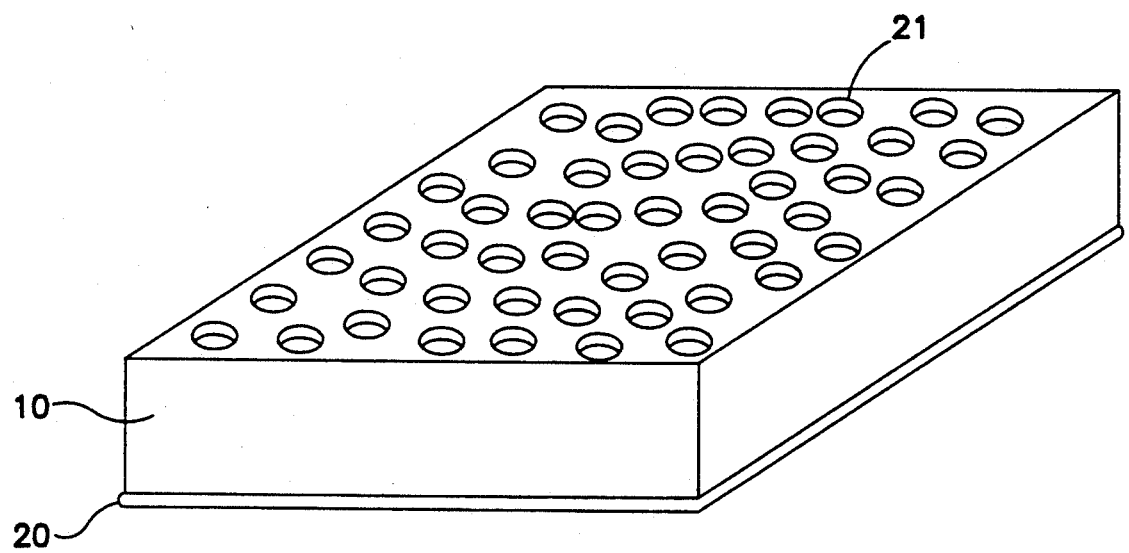

FIG. 3 shows a third embodiment of the invention in which the chiral elements are Möbius bands 21 which are superposed on the lossy dielectric material 10.

Figure 4:
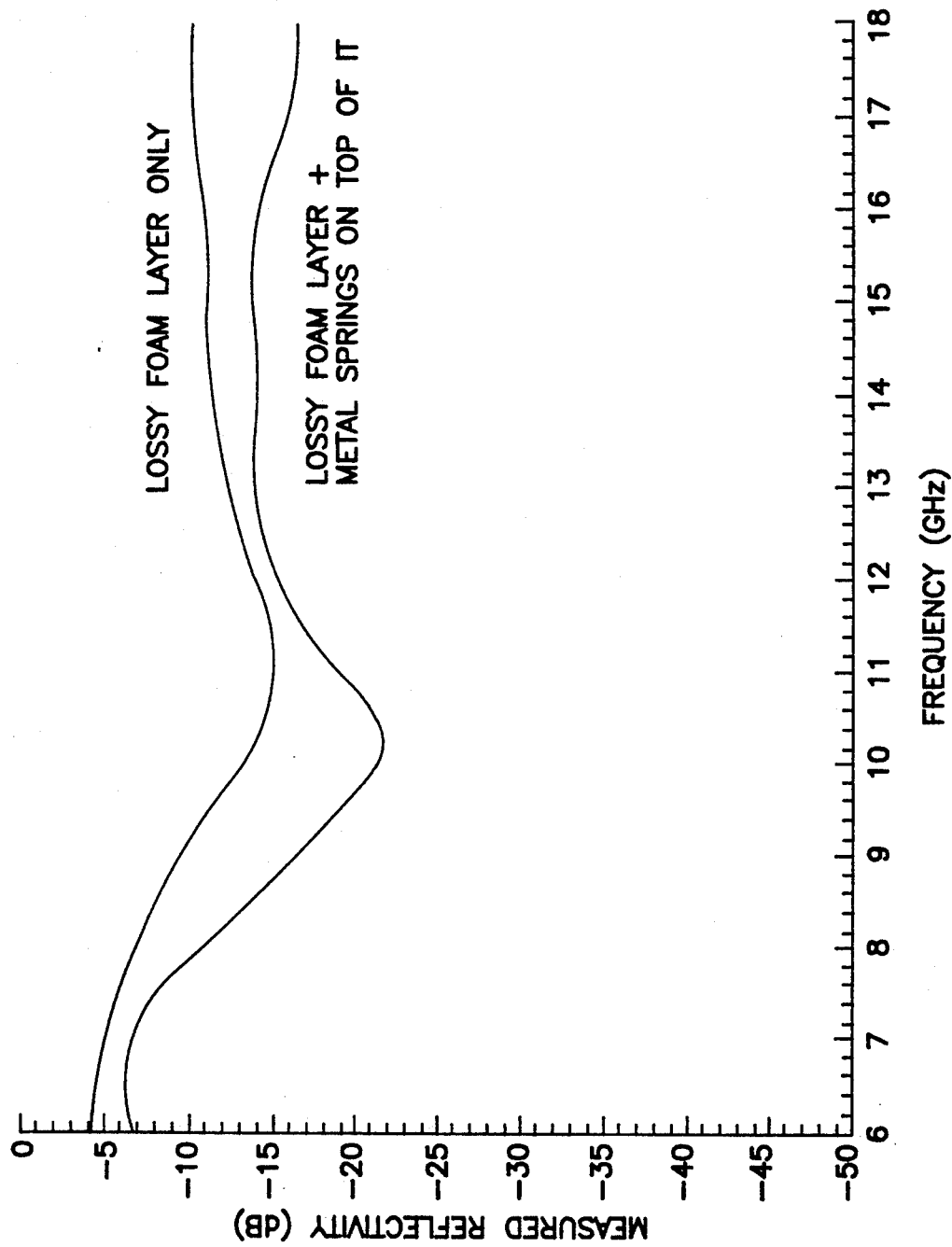
FIGS. 4-9 show results obtained from absorbing structures made according to the invention.
Figure 5:
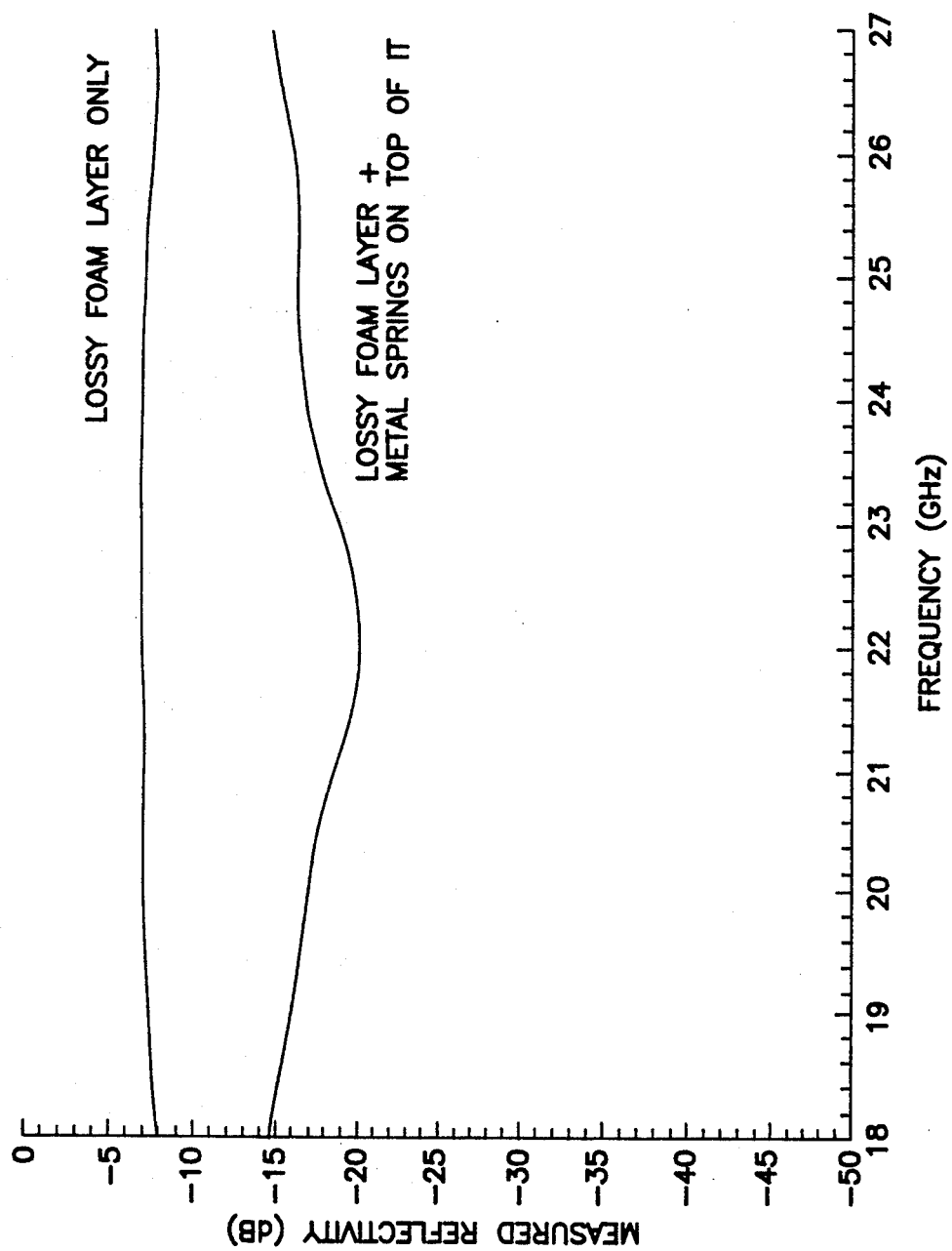

FIGS. 4 and 5 show test results obtained with an absorbing structure according to the invention. The lossy dielectric used was one of the ECCOSORB LS (T.M.) range discussed above with an insertion loss of 7.5 dB at 3 gigahertz. The chiral elements used were metallic springs of the following typical dimensions: overall length 4.7 mm; wire diameter 0.32 mm; coil diameter 2.5 mm; pitch 0.78 mm. Such springs are available from TEVEMA under the specification D 10700. The tests were carried out on a 25 cm square test piece with a surface density of springs corresponding to 4 $cm^3$ of the metal distributed homogeneously over the test piece. As can be seen, the insertion loss of the overall structure is markedly increased as compared with the lossy foam layer alone, an increase in insertion loss of up to 12 dB being achieved.

Figure 6:
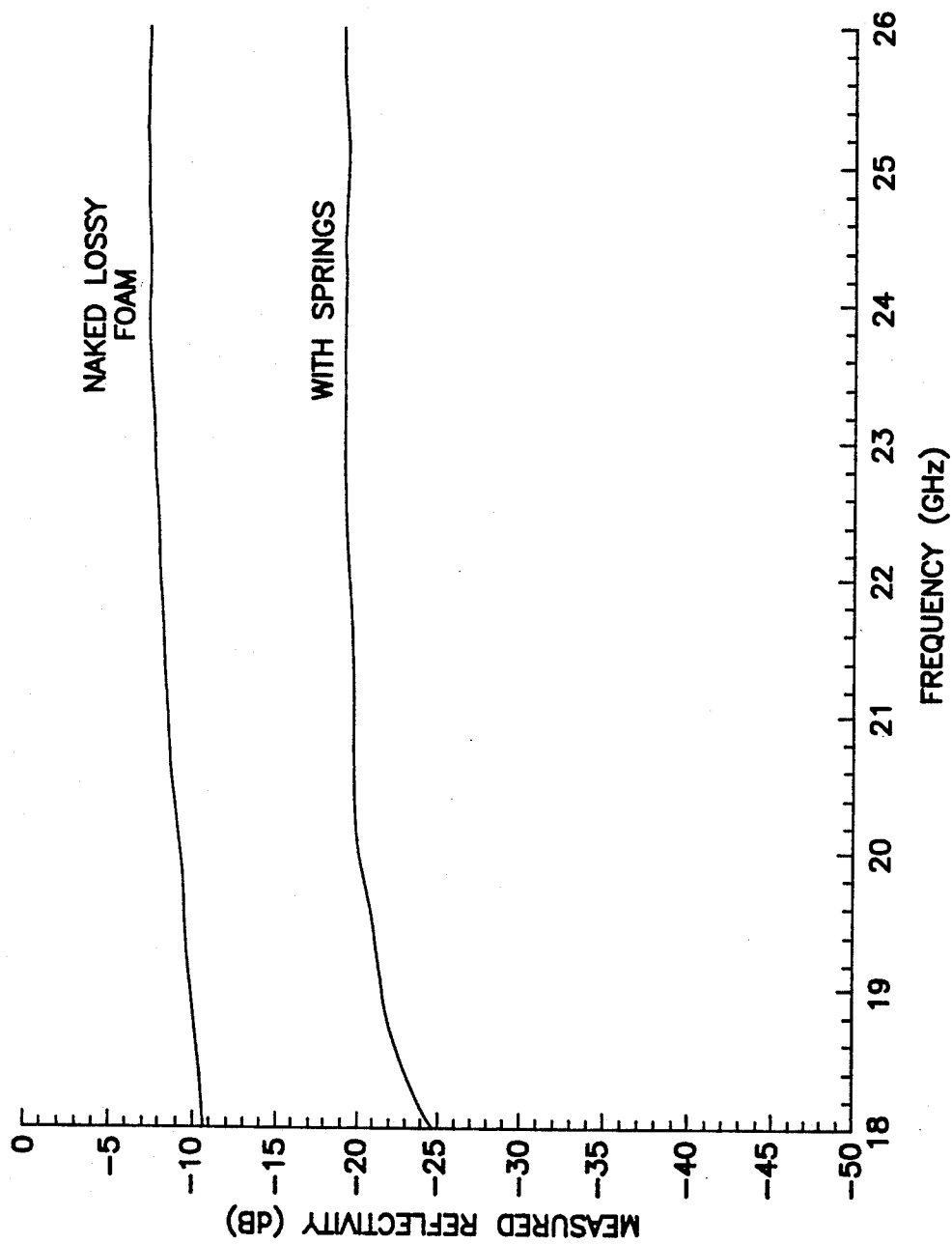

FIG. 6 shows a similar test carried out with a lossy dielectric foam of insertion loss 6.2 dB at 3 gigahertz and metallic springs of the D 10610 specification (TEVEMA). With approximately 1000 chiral elements on the 25 cm square test piece an increase in reflection attenuation of between 10 and 14 dB can be noted.

Figure 7:
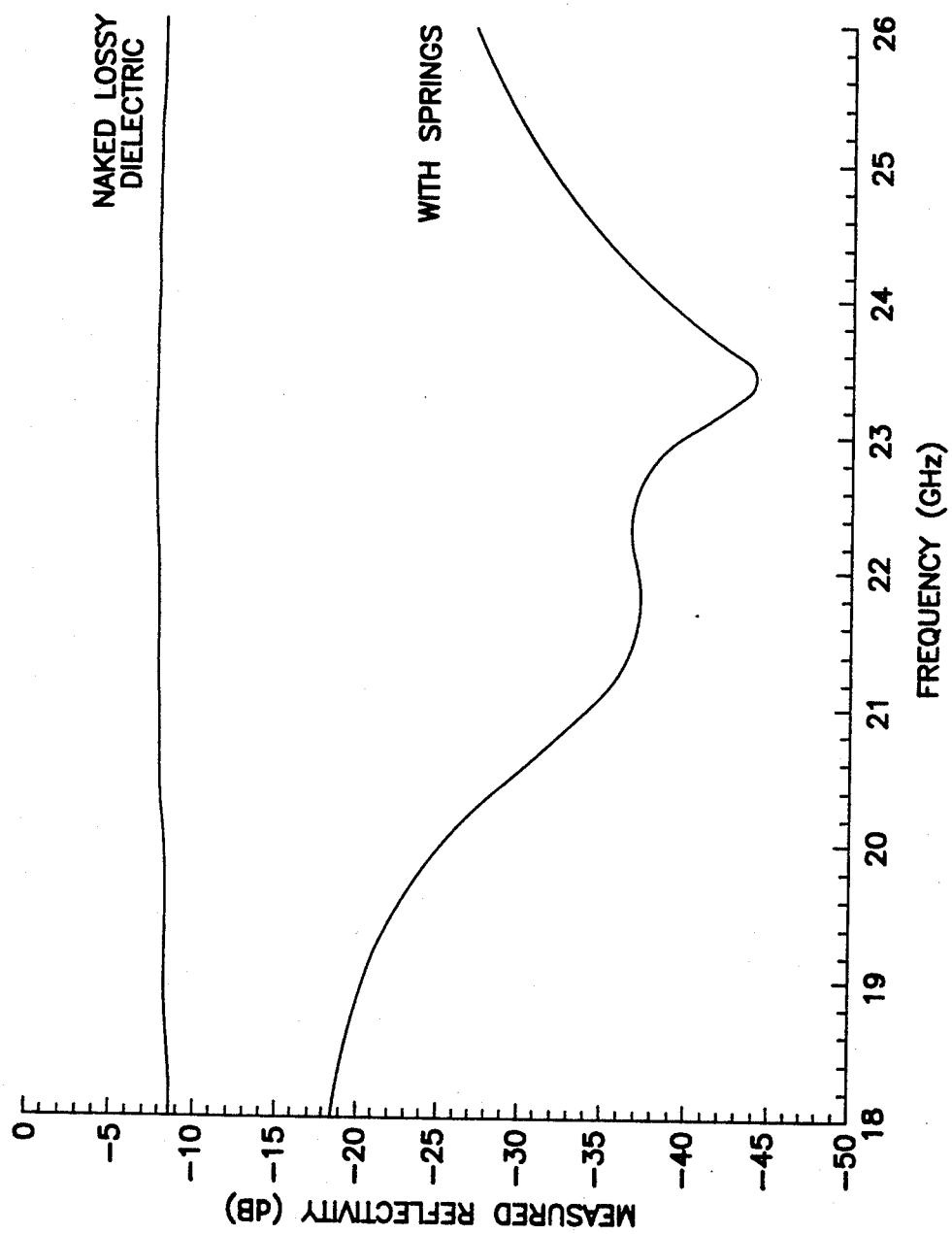

FIG. 7 shows the results of a test similar to that carried out above but with a lossy dielectric of approximately 5.7 dB insertion loss at 3 gigahertz and with 1450 springs of the D 10700 specification spread on the 25 $cm^2$ test piece. As can be seen, the reflection attenuation can be improved by up to 35 dB by the addition of the chiral elements.

Figure 8:
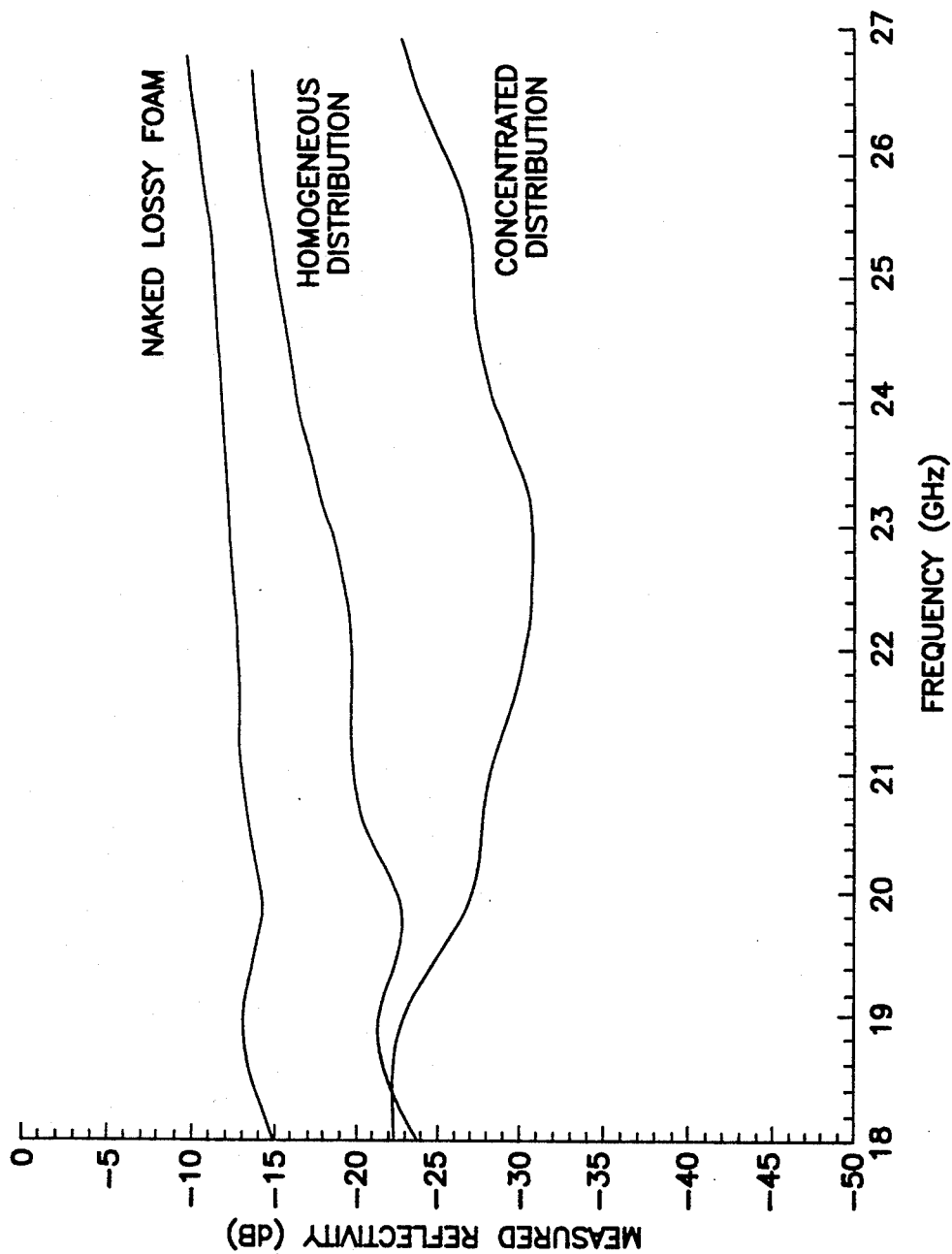

FIG. 8 shows the results of a similar test with a lossy dielectric of insertion loss 7.3 dB at 3 gigahertz and chiral elements of the D 10610 specification (TEVEMA). The results are shown for instances where the helices are homogeneously distributed (the middle of the three curves) and where the helices are concentrated towards the centre of the test sample (the lower of the three curves). As can be seen, an improvement in reflection attenuation of up to 15 dB is possible.

In the range 2-26 GHz, a concentration of helices on the lossy dielectric which corresponds to $6 \times 10^{-3} - 10 \times 10^{-3}$ $cm^3$ of metal per $cm^2$ of absorber surface is preferable but not essential.

Figure 9:
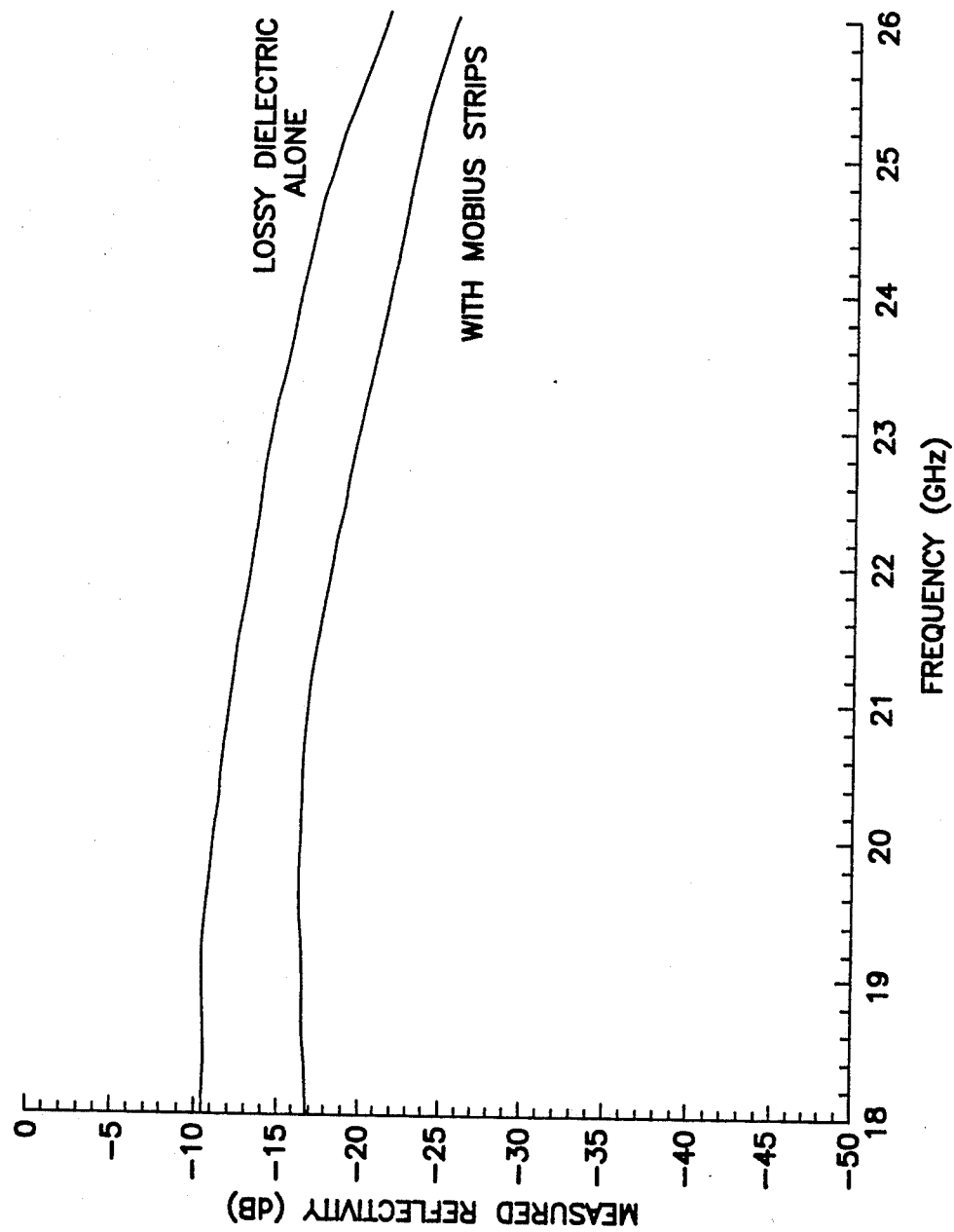

FIG. 9 shows the results of tests carried out on absorbers according to the invention in which the chiral elements are Möbius bands. The lossy dielectric medium was in this instance a lossy foam of 6.25 dB insertion loss at 3 GHz and the Möbius bands were formed of a carbon loaded polycarbonate ("Macrofol" available from Bayer). The Möbius bands are of 20cm length and 5mm wide. With a concentration of 36 rings on the 25cm square test piece, an increase in insertion loss of approximately 7 dB can be achieved.

The lossy dielectric layer may also be shaped into forms which may be cones, wedges, pyramids or oblate spheroids as appropriate, and be made of materials with increasing insertion loss through their depth. Such shaped forms are well-known in the art and commercially available, e.g. ECCOSORB (T.M.) WG-NRL and ECCOSORB (T.M.) VHP-NRL pyramidal absorber available from Grace NV.

FIG. 10 shows a fourth embodiment of the invention in which the lossy dielectric medium 30 is shaped to form, in this instance a hollow wedge shown in cross section, for use in an anti-reflection structure, e.g. an anechoic chamber, a wall 33 of which is shown. The structure shown is hollow, although it may be solid and comprises chiral elements on its surface. These elements may either be "naked" or embedded in a non-lossy layer such as a foam 13.

Figure 11B:
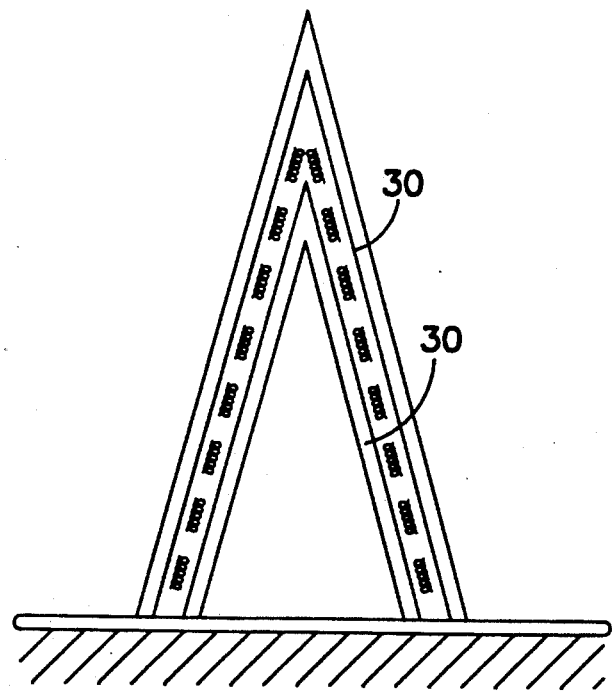

FIGS. 11a and 11b show alternative embodiments to FIG. 10 in which the chiral elements may be on the inside of the lossy dielectric structure, or may be enclosed between two substructures shaped to form the overall structure. In either instance the chiral elements may be embedded in a foam. Alternatively, the chiral elements may be arranged on one or more of the surfaces of the lossy dielectric shown in FIG. 11b.

Further improvement in reflection attenuation can be achieved by mounting their structures on a backing surface of ferrite tiles. An alternative to the immersion of a polyurethane foam in a carbon suspension to produce the lossy foam is to use a vinyl composition and incorporate into it carbon fibres. This is of particular interest in the manufacture of geometrically shaped absorbing structures when mechanical considerations are more important than in the case of the sheet absorbers discussed in connection with FIGS. 1-3.

An alternative to the coil springs or Mobius strips for the chiral elements include a) irregular tetrahedra, b) tapering coil springs (either with constant pitch and reducing diameter, or constant diameter or reducing pitch or a combination of both), c) screws or d) forks with at least three prongs which form an asymmetrical non planar structure. Improvements can also be obtained with mixtures of chiral elements of the same handedness but which give rise to different $\beta$ values through the absorbing structure.

Such chiral elements, e.g. springs, need not be metallic but it is expected that they will be at least to some extent conductive, and may be of copper, carbonyl iron, brass, steel, a ferromagnetic metal or alloy, ceramic, graphite, or conductive polymer (whether inherently conductive, or conductive by addition).

While the present invention has been described with reference to its preferred embodiments, other modifications can achieve the same result. Variations and modifications of the present invention will be obvious to those skilled in the art and it is intended in the appended claims to cover all such modifications and equivalents as fall within the true spirit and scope of this invention.

What we claim:

1. A structure for absoring radiation in the range of 10 megahertz to 100 gigahertz comprising: (a) a geometrically shaped lossy dielectric medium; and (b) chiral elements disposed in a non-lossy material outside the lossy dielectric medium.

2. The structure according to claim 1 wherein the non-lossy material is free space.

3. The structure according to claim 1 wherein the non-lossy material is a non-lossy foam.

4. The structure according to claim 1 wherein the chiral elements are selected from the group consisting of irregular tetrahedra; helical springs; tapering helical springs; Mobius bands; screws; forks with at least three non-symmetrically arranged non co-planar prongs: and mixtures thereof.

5. The structure according to claim 1 wherein the chiral elements are disposed adjacent a surface of the geometrically shaped lossy dielectric medium.

6. The structure according to claim 1 wherein the chiral elements are disposed between surfaces of two substructures of the lossy dielectric material shaped to produce the geometric shaping of the absorbing structure.

7. The structure according to claim 1 wherein the chiral elements are metallic.

8. The structure according to claim 1 wherein the chiral elements are resistive.

9. The structure according to claim 1 wherein the lossy dielectric medium is shaped in a form selected from the group consisting of cones, wedges, pyramids and oblate spheroids.

10. The structure according to claim 1 wherein the chiral elements are disposed on an internal surface of a hollow geometrically shaped lossy dielectric medium.

11. The structure according to claim 1 wherein the lossy dielectric medium is hollow.

12. The structure according to claim 1 further comprising a layer of ferrite tiles arranged on a side of the structure remote from the source of incident radiation.

13. A structure for absorbing electromagnetic radiation comprising:
   a.) a geometrically shaped lossy dielectric medium;
   b.) chiral elements disposed in a non-lossy material outside of the lossy dielectric medium; and
   c.) a layer of ferrite tiles arranged on a side of the structure remote from the source of incident radiation.

14. The structure according to claim 13 wherein the non-lossy material is free space.

15. The structure according to claim 13 wherein the non-lossy material is a non-lossy foam.

16. The structure for absorbing electromagnetic radiation comprising:
   a.) a first geometrically shaped lossy dielectric medium;
   b.) a second geometrically shaped lossy dielectric medium spaced apart from and surrounding the first dielectric medium; and
   c.) chiral elements disposed between the surfaces of the first and second lossy dielectric mediums.

17. The structure according to claim 16 wherein the chiral elements are disposed in a non-lossy foam; the chiral elements are selected from the group consisting of irregular tetrahedra; helical springs; tapered helical springs; moebius bands; screws; forks with at least three non-symetrically arranged non coplanar prongs and mixtures thereof.

18. The structure according to claim 16 further comprising a layer of ferrite tiles arranged on a side of the structure remote from the source of incident radiation.

* * * * *